(12) United States Patent
Fukudome

(10) Patent No.: US 9,236,184 B2
(45) Date of Patent: Jan. 12, 2016

(54) MONOLITHIC CERAMIC ELECTRONIC COMPONENT AND METHOD FOR MANUFACTURING THE SAME

(75) Inventor: Hidetaka Fukudome, Kusatsu (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 954 days.

(21) Appl. No.: 13/437,971

(22) Filed: Apr. 3, 2012

(65) Prior Publication Data

US 2013/0091701 A1    Apr. 18, 2013

Related U.S. Application Data

(62) Division of application No. 12/504,831, filed on Jul. 17, 2009, now Pat. No. 8,174,815.

(30) Foreign Application Priority Data

Jul. 22, 2008  (JP) .................................. 2008-188398

(51) Int. Cl.

| | |
|---|---|
| *H01K 3/10* | (2006.01) |
| *H01R 43/00* | (2006.01) |
| *H05K 3/00* | (2006.01) |
| *H05K 3/36* | (2006.01) |
| *H01G 4/30* | (2006.01) |
| *H01L 27/108* | (2006.01) |
| *H01L 29/94* | (2006.01) |
| *H01G 4/12* | (2006.01) |
| *H01G 4/232* | (2006.01) |
| *H01L 23/50* | (2006.01) |

(52) U.S. Cl.
CPC ................. *H01G 4/12* (2013.01); *H01G 4/232* (2013.01); *H01G 4/30* (2013.01); *H01L 23/50* (2013.01); *H01L 2224/16225* (2013.01); *H01L 2924/3011* (2013.01); *Y10T 29/435* (2015.01); *Y10T 29/49165* (2015.01); *Y10T 29/49204* (2015.01)

(58) Field of Classification Search
CPC ................... Y10T 29/49117; Y10T 29/49124; Y10T 29/49126; Y10T 29/49165; H02G 1/1256; H01L 2924/01079; H01L 2924/01078; H01L 27/10852; H05K 3/4069; H01G 4/30
USPC ................. 29/852, 825, 829, 830; 361/301.4; 257/303
See application file for complete search history.

(56) References Cited

U.S. PATENT DOCUMENTS

| 6,577,486 B1 * | 6/2003 | Nishimiya et al. ............ 361/104 |
|---|---|---|
| 7,505,247 B2 * | 3/2009 | Lee ................................ 361/303 |

(Continued)

OTHER PUBLICATIONS

Fukudome; "Monolothic Ceramic Electronic Component and Method for Manufacturing the Same"; U.S. Appl. No. 12/504,831, filed Jul. 17, 2009.

*Primary Examiner* — David Angwin
(74) *Attorney, Agent, or Firm* — Keating & Bennett, LLP

(57) ABSTRACT

In a method for manufacturing a monolithic ceramic electronic component, when an inner conductor is formed by printing an electrically conductive paste, a smear may be generated in an opening of the inner conductor at a side of the opening near to a position from which printing is started in a printing direction. The smear may cause an unwanted contact between the inner conductor and a via conductor, which is a conductor extending through the opening and having a potential different from that of the inner conductor, so as to cause a short-circuit. The inner conductor is printed such that the center of each via conductor is deviated from the center of the opening in the direction in which the electrically conductive paste is printed. With this structure, even if the smear is generated in the opening, the probability of a short-circuit is minimized.

1 Claim, 19 Drawing Sheets

(56) References Cited

U.S. PATENT DOCUMENTS

| | | | |
|---|---|---|---|
| 7,932,471 B2* | 4/2011 | Yamamoto et al. | 174/260 |
| 2004/0021158 A1* | 2/2004 | Mikawa et al. | 257/295 |
| 2004/0055693 A1* | 3/2004 | Maekawa et al. | 156/89.12 |
| 2004/0168824 A1* | 9/2004 | Sekido | 174/256 |
| 2005/0007724 A1* | 1/2005 | Murakami et al. | 361/321.2 |
| 2006/0081977 A1* | 4/2006 | Sakai et al. | 257/703 |

* cited by examiner

MONOLITHIC CERAMIC ELECTRONIC COMPONENT AND METHOD FOR MANUFACTURING THE SAME

BACKGROUND OF THE INVENTION

1. Field of the Invention

The present invention relates to a monolithic ceramic electronic component and a method for manufacturing the monolithic ceramic electronic component. In particular, the present invention relates to a monolithic ceramic electronic component including a ceramic body having inner conductors and via conductors, and to a method for manufacturing the monolithic ceramic electronic component.

2. Description of the Related Art

Regarding a power supply circuit, when a voltage fluctuation of a power line is increased due to an impedance of the power line or ground, operation of circuits driven by the power supply circuit may become unstable, the circuits may interfere with each other via the power supply circuit, or an oscillation may occur. To prevent this, a decoupling capacitor is usually connected between the power line and ground. The decoupling capacitor serves to reduce the impedance between the power line and ground, and to suppress fluctuation of a power supply voltage and interference between the circuits.

In recent years, high-speed signals have been used in communication equipment, such as mobile phones, and information processing equipment, such as personal computers, in order to handle a large amount of information, and clock frequencies of ICs used in such equipment have increased. Therefore, noise including a lot of harmonic content is easily generated, which necessitates more effective decoupling for an IC power supply circuit.

Using a decoupling capacitor with an excellent impedance frequency characteristic is effective for increasing a decoupling effect. A monolithic ceramic capacitor is an example of such a decoupling capacitor. Because a monolithic ceramic capacitor has a low ESL (equivalent series inductance), a monolithic ceramic capacitor has an excellent noise absorption characteristic across a frequency band wider than that of an electrolytic capacitor.

To increase a decoupling effect, disposing a decoupling capacitor as near as possible to power pins of an IC is also effective. This is because, when the distance between power pins of an IC and the decoupling capacitor is short, parasitic inductance of lines therebetween is low and the impedance of a power line becomes low.

FIGS. 16 to 18 show a monolithic ceramic capacitor 1 disclosed in Japanese Unexamined Patent Application Publication No. 2001-203125, which is used here as an example of a conventional monolithic ceramic electronic component that is a related art. More specifically, FIG. 16 is a sectional front view of the monolithic ceramic capacitor 1, FIG. 17 is a sectional plan view taken along line XVII-XVII of FIG. 16, and FIG. 18 is a sectional plan view taken along line XVIII-XVIII of FIG. 16.

The monolithic ceramic capacitor 1 includes a ceramic body 3 in which a plurality of ceramic layers 2 are stacked. First and second inner conductors 4 and 5 are disposed in the ceramic body 3 in such a manner that the first and second inner conductors 4 and 5 extend parallel to interfaces between the ceramic layers 2. The first and second inner conductors 4 and 5 are provided in pairs so that the first and second inner conductors are disposed opposite each other with a specific one of the ceramic layers 2 therebetween.

On a main surface of the ceramic body 3, first and second outer terminal electrodes 6 and 7 are alternately formed in a matrix pattern. Likewise, on the other main surface of the ceramic body 3, the first and second outer terminal electrodes 6 and 7 are alternately formed in a matrix pattern.

First via conductors 8 and second via conductors 9 are formed in the ceramic body 3 in such a manner that the first and second via conductors 8 and 9 extend in the stack direction of the ceramic layers 2. The first via conductors 8 are electrically connected to the first inner conductors 4 and the first outer terminal electrodes 6. The first via conductors 8 are electrically isolated from the second inner conductors 5. The second via conductors 9 are electrically connected to the second inner conductors 5 and the second outer terminal electrodes 7. The second via conductors 9 are electrically isolated from the first inner conductors 4.

The monolithic ceramic capacitor 1 has a low ESL because the first and second via conductors 8 and 9 are alternately disposed so that magnetic fields generated around the first and second via conductors 8 and 9 cancel each other out. Moreover, because the first and second outer terminal electrodes 6 and 7 are formed on the upper and lower surfaces of the ceramic body 3, the monolithic ceramic capacitor 1 can be easily mounted on the bottom surface of an IC (not shown), and the distance between the monolithic ceramic capacitor 1 and the IC can be made short.

As described above, in the monolithic ceramic capacitor 1, the first via conductors 8, which have a potential different from that of the second inner conductors 5, are electrically isolated from the second inner conductors 5, and the second via conductors 9, which have a potential different from that of the first inner conductors 4, are electrically isolated from the first inner conductors 4. For this isolation, the first inner conductors 4 have openings 10 through which the second via conductors 9, which have a potential different from that of the first inner conductors 4, extend. The second inner conductors 5 have openings 11 through which first via conductors 8, which have a potential different from that of the second inner conductors 5, extend. The first and second via conductors 8 and 9 respectively extend through the centers of the openings 11 and 10.

The first and second inner conductors 4 and 5 are formed by printing an electrically conductive paste on ceramic green sheets that will become the ceramic layers 2 by a printing method such as screen printing. However, as shown in FIG. 19, when the electrically conductive paste 12 is printed, a smear 14 may be generated in the opening 10 or 11 of the first or second inner conductor 4 or 5 at a side of the opening near to a position from which printing is started in the printing direction 13 by the printing method. If the smear 14 is large, the first or second inner conductor 4 or 5 may contact the first or second via conductor 9 or 8 having a different potential and cause a short-circuit.

As described above, screen printing is an example of a printing method that may generate a smear. As long as an electrically conductive paste is used, other printing methods, such as a gravure printing method, may have a similar problem.

SUMMARY OF THE INVENTION

Accordingly, preferred embodiments of the present invention provide monolithic ceramic electronic components that solve the above-described problems and a method for manufacturing the monolithic ceramic electronic component.

According to a preferred embodiment of the present invention, a monolithic ceramic electronic component includes a ceramic body in which a plurality of ceramic layers are stacked, inner conductors disposed in the ceramic body in such a manner that the inner conductors extend parallel or substantially parallel to interfaces between the ceramic layers, and via conductors disposed in the ceramic body in such a manner that the via conductors extend in a stack direction of the plurality of ceramic layers, wherein the inner conductors have openings through which the via conductors extend, the inner conductors being electrically isolated from the via conductors with the openings, and wherein centers of the via conductors are deviated from centers of the openings in a specified direction.

It is preferable that the monolithic ceramic electronic component further includes outer terminal electrodes disposed on an outer surface of the ceramic body, the outer terminal electrodes being electrically connected to specific via conductors, wherein the inner conductors include at least a pair of first and second inner conductors, the first and second inner conductors being disposed parallel to the interfaces between the ceramic layers, and wherein the via conductors include first via conductors and second via conductors, the first via conductors being electrically connected to the first inner conductors while being electrically isolated from the second inner conductors with the openings, and the second via conductors being electrically connected to the second inner conductors while being electrically isolated from the first inner conductors with the openings.

It is preferable that, in the monolithic ceramic electronic component, the openings have a shape having a length and a width, the length being the same as the direction in which the center of each of the via conductors is deviated from the center of the opening.

Other preferred embodiments of the present invention are directed to a method for manufacturing a monolithic ceramic electronic component having the above-described structure.

According to a preferred embodiment of the present invention, a method for manufacturing a monolithic ceramic electronic component includes the steps of preparing a plurality of ceramic green sheets, forming an inner conductor having openings on a specific one of the plurality of ceramic green sheets by printing an electrically conductive paste, and forming via conductors in positions in a pattern of the inner conductor corresponding to the openings such that the via conductors extend through the specific one of the plurality of ceramic green sheets in a thickness direction, wherein, in the step for forming the inner conductor, the inner conductor is formed in such a manner that the centers of the via conductors are deviated from the centers of the openings in a direction in which the electrically conductive paste is printed.

According to various preferred embodiments of the present invention, the center of each of the via conductors is deviated from the center of the opening of the inner conductor in the direction in which the electrically conductive paste is printed. Therefore, even if a smear is generated in the opening at a side of the opening near to a position from which printing is started in the printing direction, the probability that the inner conductors contact the via conductors and cause a short-circuit is minimized.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
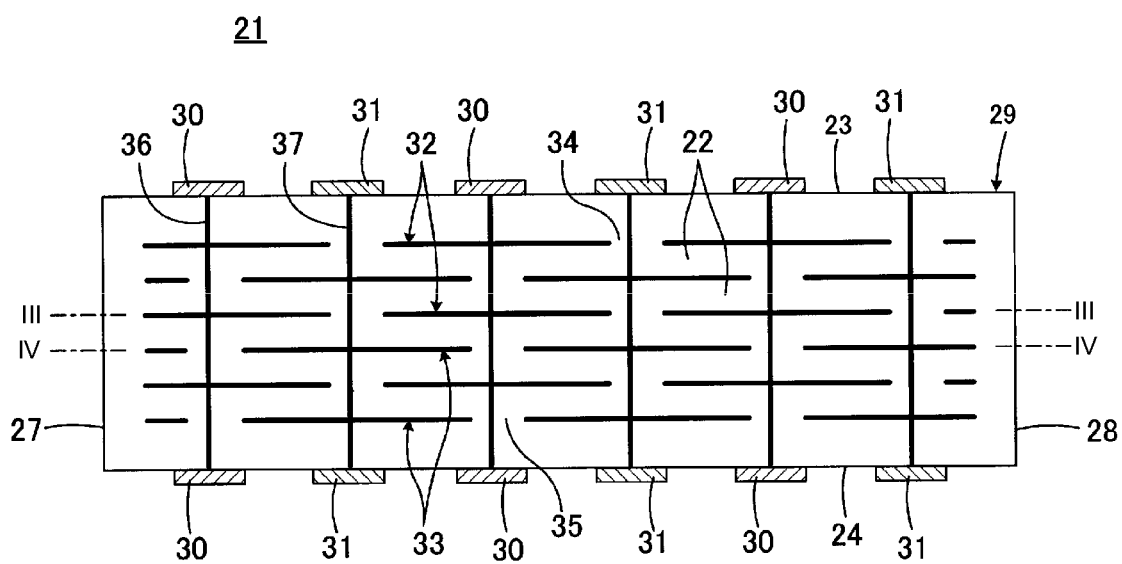
FIG. 1 is a sectional front view of a monolithic ceramic capacitor as an example of a monolithic ceramic electronic component according to a first preferred embodiment of the present invention.
Figure 2:
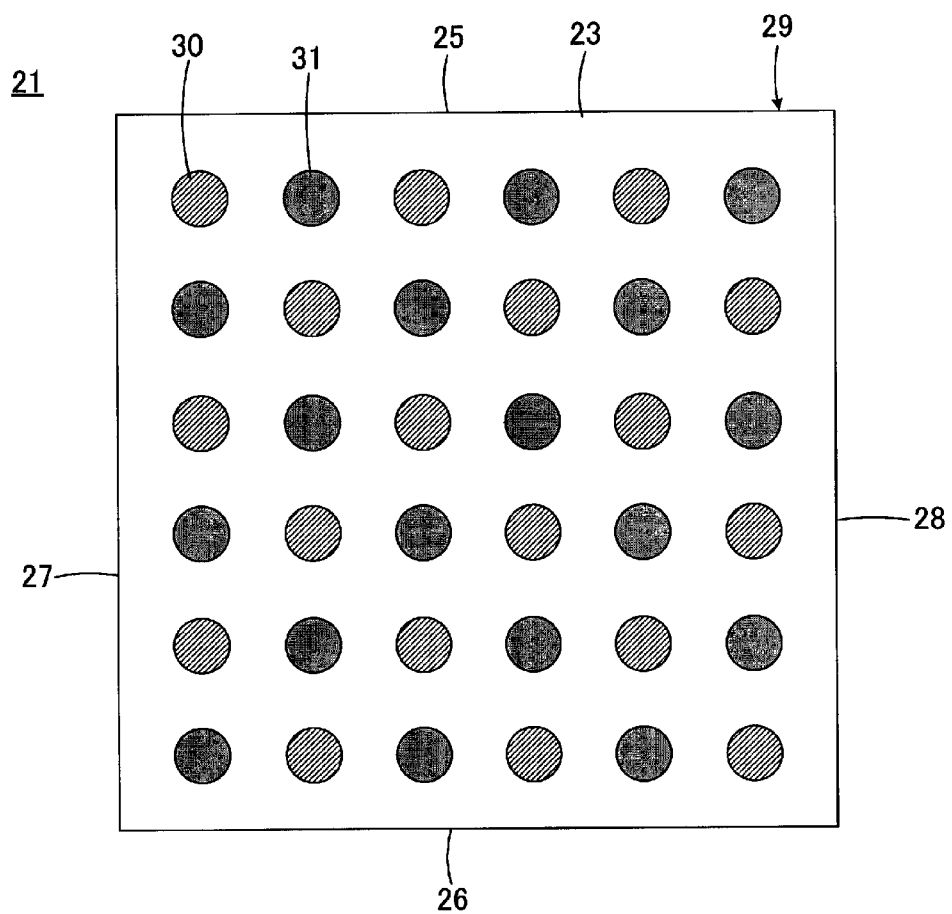
FIG. 2 is an external plan view of the monolithic ceramic capacitor shown in FIG. 1.
Figure 3:
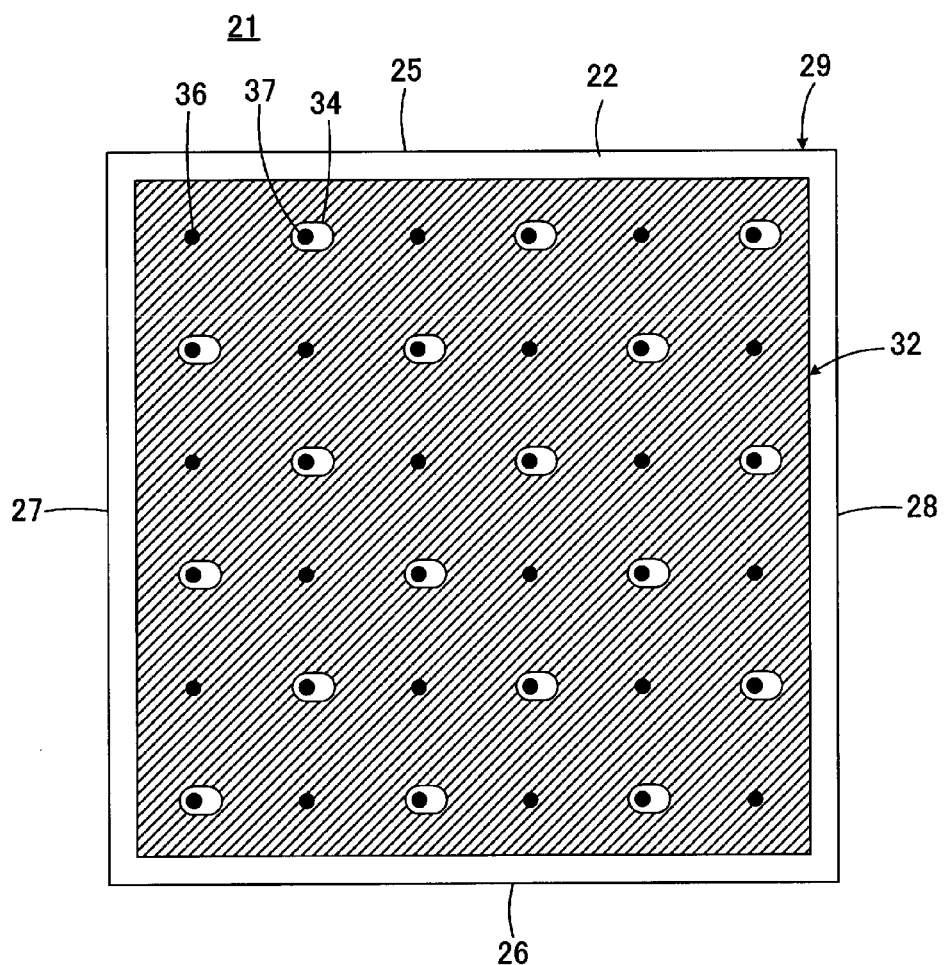
FIG. 3 is a sectional plan view of the monolithic ceramic capacitor shown in FIG. 1, taken along line III-III of FIG. 1.
Figure 4:
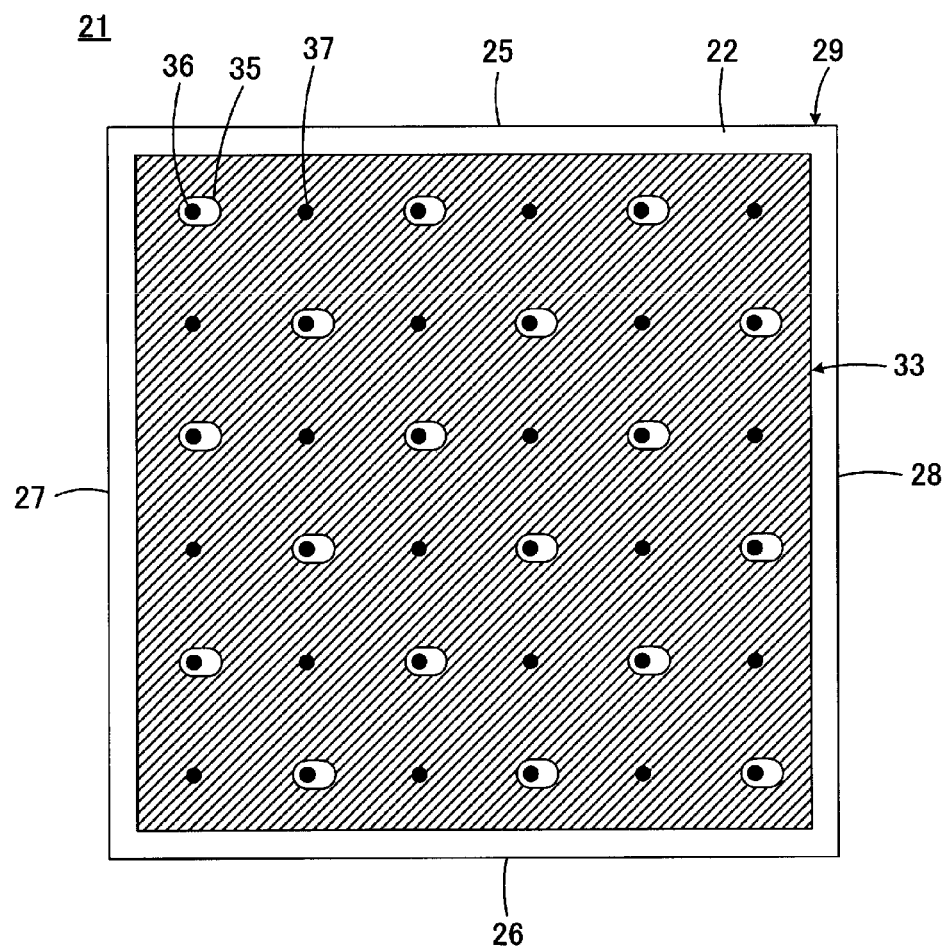
FIG. 4 is a sectional plan view of the monolithic ceramic capacitor shown in FIG. 1, taken along line IV-IV of FIG. 1.

FIGS. 1 to 6, for illustrating a first preferred embodiment of the present invention, show a monolithic ceramic capacitor 21 as an example of a monolithic ceramic electronic component. FIG. 1 is a sectional front view of the monolithic ceramic capacitor 21, FIG. 2 is an external plan view of the monolithic ceramic capacitor 21, FIG. 3 is a sectional plan view of the monolithic ceramic capacitor 21 taken along line III-III of FIG. 1, and FIG. 4 is a sectional plan view of the monolithic ceramic capacitor taken along line IV-IV of FIG. 1.

The monolithic ceramic capacitor 21 includes a ceramic body 29 in which a plurality of ceramic layers 22 are stacked. The ceramic body 29 has a first main surface 23 and a second main surface 24 that are opposite each other, and first to fourth side surfaces 25 to 28 connecting the main surfaces. The first side surface 25 and the second side surface 26 are opposite each other. The third side surface 27 and the fourth side surface 28 are opposite each other.

On the first main surface 23, first outer terminal electrodes 30 and second outer terminal electrodes 31 are alternately disposed in a matrix pattern. On the second main surface 24, first and second outer terminal electrodes 30 and 31 are disposed in the same manner.

First inner conductors 32 and second inner conductors 33 are disposed in the ceramic body 29 in such a manner that the first and second inner conductors extend parallel or substantially parallel to interfaces between the ceramic layers 22. The first inner conductors 32 and the second inner conductors 33 are disposed in such a manner that each of the first inner conductors 32 and a corresponding one of the second inner conductors 33 are opposite each other with a specific one of the ceramic layers 22 therebetween so as to have a capacitance. The first inner conductors 32 have first openings 34, and the second inner conductors 33 have second openings 35.

First via conductors 36 and second via conductors 37 are disposed in the ceramic body 29 in such a manner that the first and second via conductors 36 and 37 extend in the stack direction of the ceramic layers 22. The first and second via conductors 36 and 37 are alternately disposed in a matrix pattern. Because electric currents flow in opposite directions in adjacent first and second via conductors 36 and 37, the directions of magnetic fields generated around the first and second via conductors 36 and 37 are opposite each other, and the magnetic fields cancel each other out. Therefore, the monolithic ceramic capacitor 21 has a low ESL.

The first via conductors 36 are electrically connected to the first inner conductors 32. The first via conductors 36 extend through the second openings 35 so as to be electrically isolated from the second inner conductors 33. The second via conductors 37 are electrically connected to the second inner conductors 33. The second via conductors 37 extend through the first openings 34 so as to be electrically isolated from the first inner conductors 32.

The second via conductors 37 extend through the first openings 34 in such a manner that the centers of the second via conductors 37 are deviated from the centers of the first openings 34 in a specified direction. Likewise, the first via conductors 36 extend through the second openings 35 in such a manner that the centers of the first via conductors 36 are deviated from the centers of the second openings 35 in a specified direction. The shapes of the first and second openings 34 and 35 are, for example, elliptic, but may be other shapes. When the first and second openings 34 and 35 have shapes with lengths and widths, it is preferable that the length directions are the same as the directions in which respective centers of the first and second via conductors 36 and 37 are deviated from the centers of the first and second openings 34 and 35.

Figure 5:
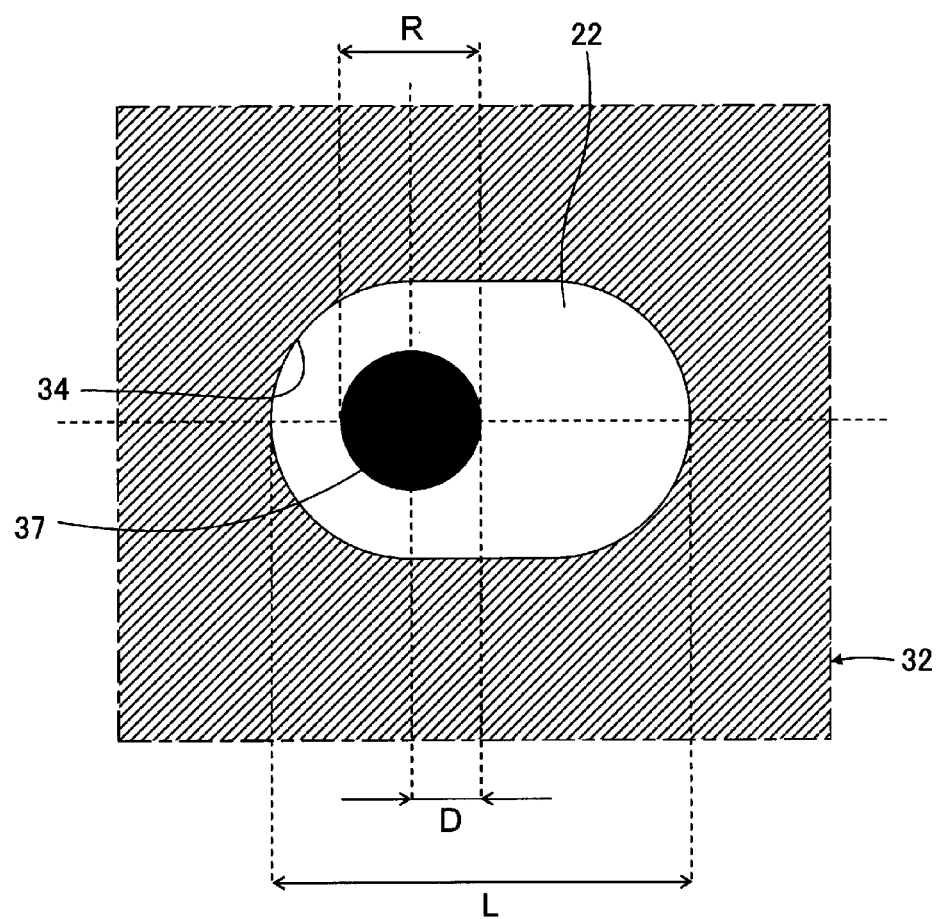
FIG. 5 is an enlarged view of a first inner conductor 32 shown in FIG. 3, showing a portion in which a first opening is formed.

FIG. 5 is an enlarged view of one of the first openings 34. When the length of the first opening 34 is L and the distance between the center of the second via conductor 37 and the center of the first opening 34 is D, it is preferable that L/D be equal to or smaller than 14. When the diameter of the second via conductor 37 is R, the values of R, D, and L are set such that $(R/2+D)<L/2$ in order to prevent the second via conductor 37, whose position is deviated, from contacting the first inner conductor 32.

A similar relationship holds for the second opening 35 and the first via conductor 36, although illustrations and descriptions are omitted. Hereinafter, illustration and description are made for the first opening 34 and the second via conductor 37, while those for the second opening 35 and the first via conductor 36 are omitted.

Figure 6:
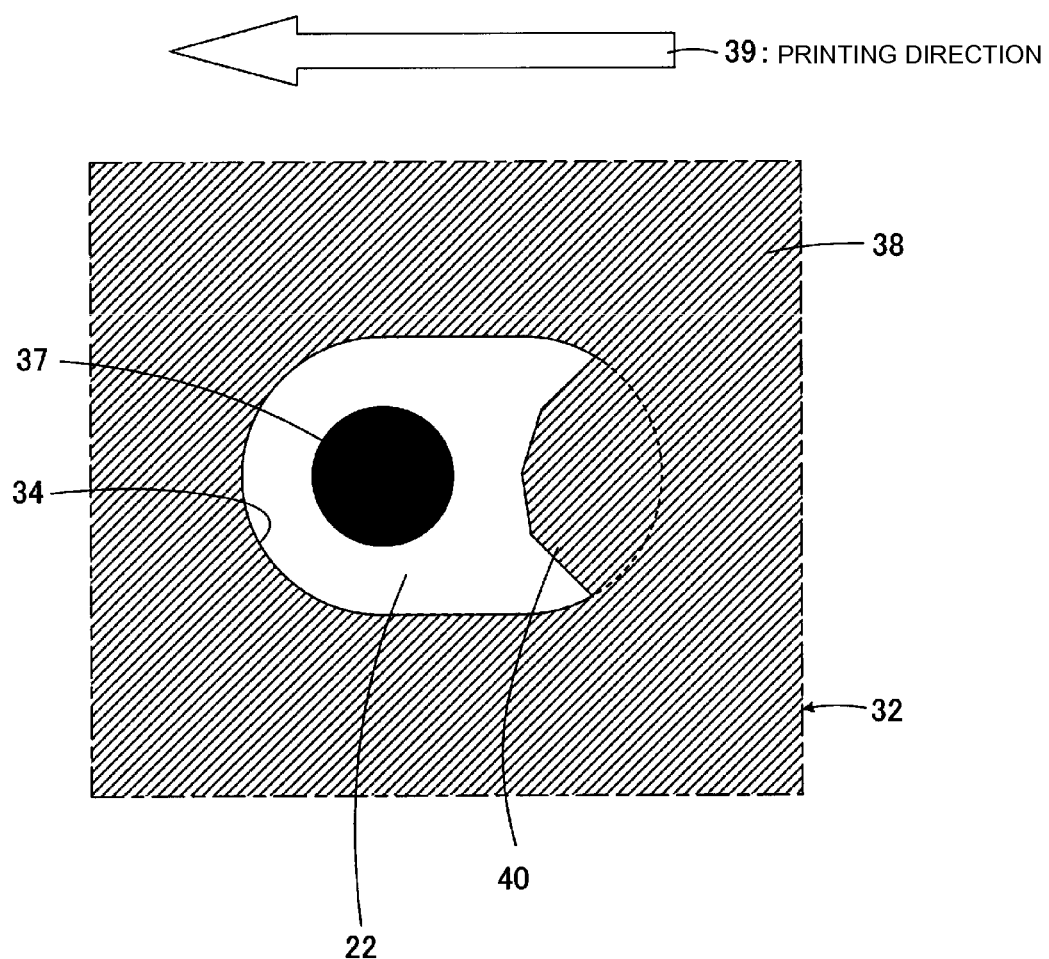
FIG. 6 is a view corresponding to FIG. 5, showing a case in which a smear has been generated.
Figure 7:
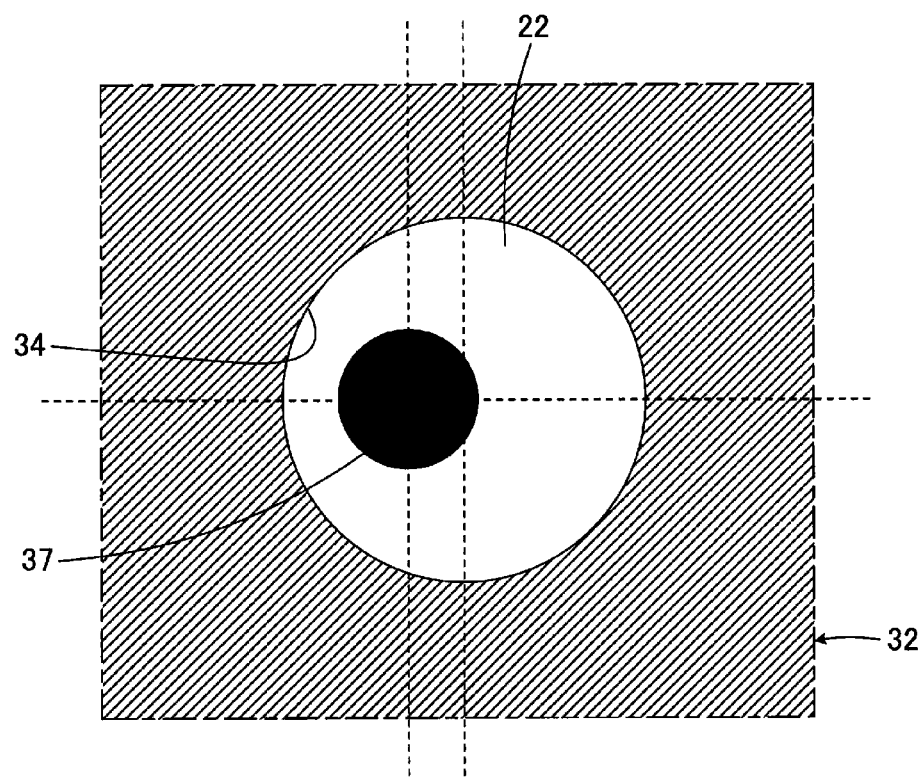
FIG. 7 is a view corresponding to FIG. 5, showing a first modification of the shape of the first opening.
Figure 8:
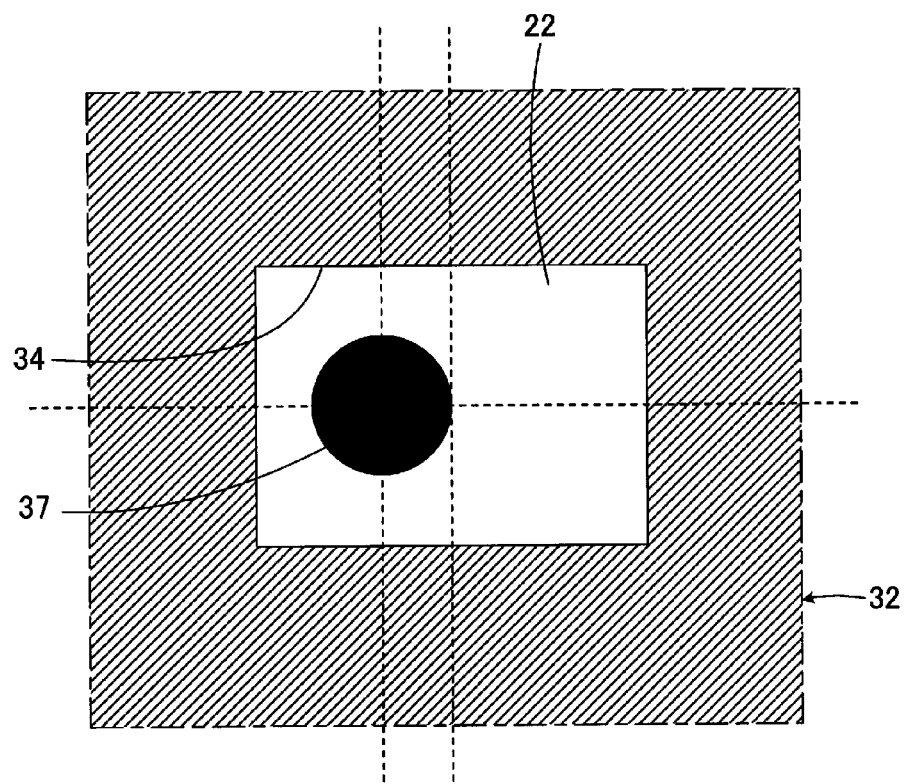
FIG. 8 is a view corresponding to FIG. 5, showing a second modification of the shape of the first opening.
Figure 9:
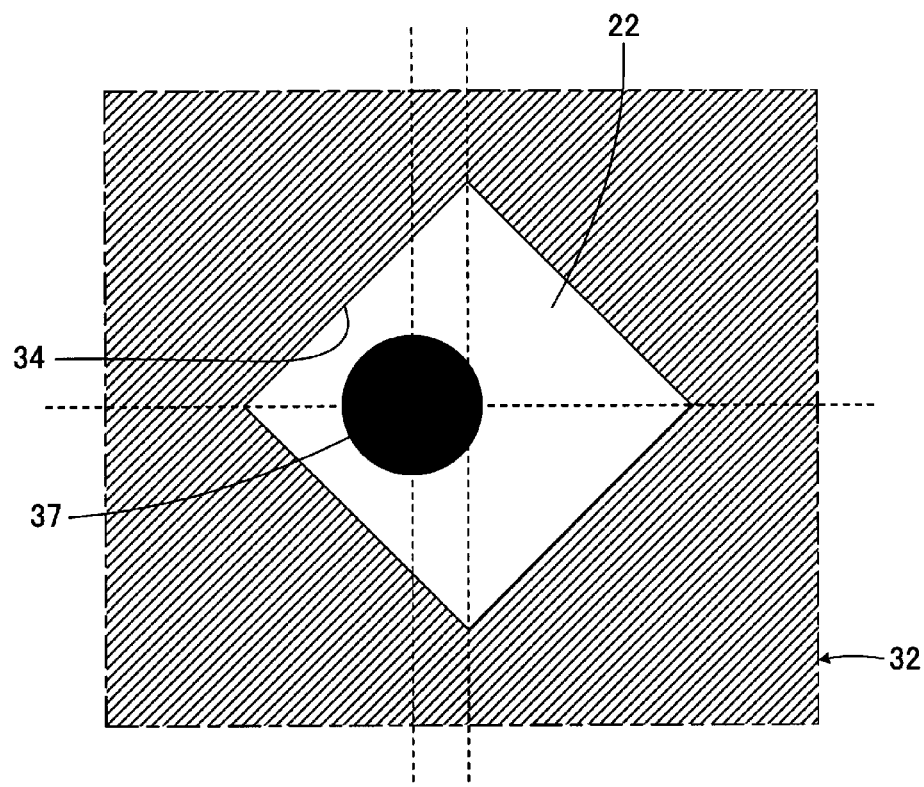
FIG. 9 is a view corresponding to FIG. 5, showing a third modification of the shape of the first opening.
Figure 10:
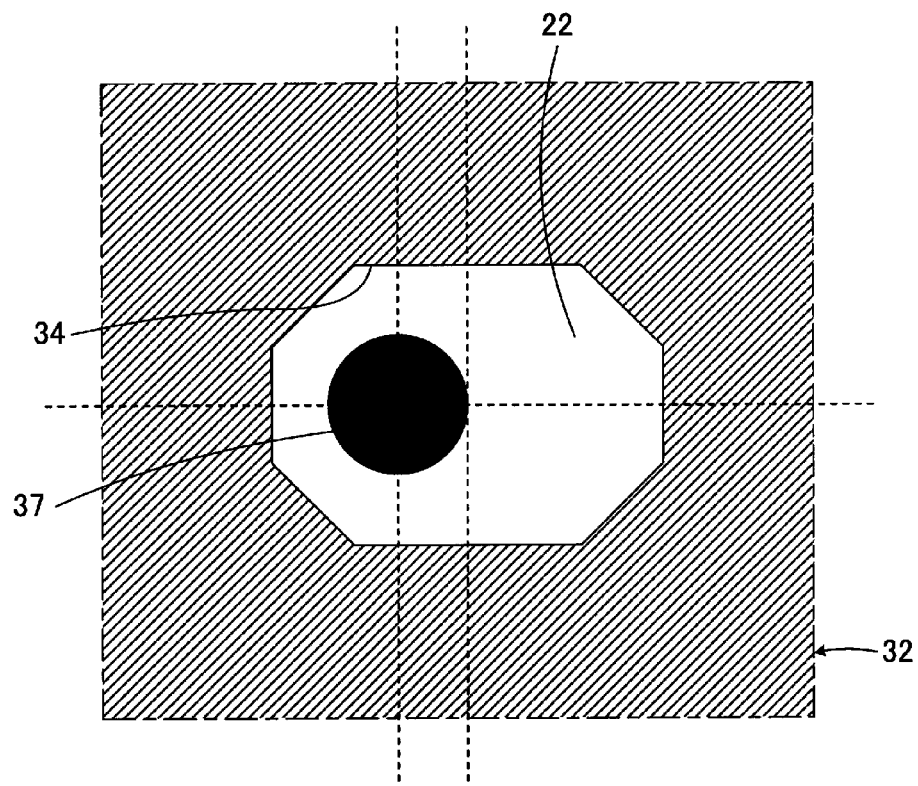
FIG. 10 is a view corresponding to FIG. 5, showing a fourth modification of the shape of the first opening.

FIG. 6 is a schematic view for describing an advantage of various preferred embodiments of the present invention. When a first inner conductor 32 is printed by printing an electrically conductive paste 38 by a printing method such as screen printing, a smear 40 may be generated in the first inner conductor 32 at a side near to a position from which printing is started in printing direction 39 as shown in FIG. 6 and the first inner conductor 32 may be formed in such a manner that the smear 40 intrudes upon a portion of the first opening 34. Even in this case, because the second via conductor 37 is deviated in the printing direction, the probability that the first inner conductor 32 contacts the second via conductor 37 is reduced. Note that, even when the smear 40 is generated, the term "the center of the opening" in the present invention refers to the original center of the opening when the smear is not generated.

FIGS. 7 to 10 are views corresponding to FIG. 5, showing modifications of the shape of the first opening 34. In FIGS. 7 to 10, the elements corresponding to the elements shown in FIG. 5 are indicated by like numerals used in FIG. 5, and redundant description is omitted.

The shape of the first opening 34 can be changed in various ways as shown in FIGS. 7 to 10. The first opening 34 preferably is substantially circular in FIG. 7, substantially rectangular in FIG. 8, substantially square in FIG. 9, and substantially elongated-octagonal in FIG. 10. The area of the first inner conductor 32 is decreased by the area of a margin provided in the first opening 34 for setting back the second via conductor 37 in the length direction. However, when the first opening 34 has a shape, such as an ellipse, having a length and a width, the decreased area can be offset by an area increased in the width direction. Therefore, a shape having a length and a width is advantageous for securing an electrostatic capacity.

Referring back to FIGS. 1 to 4, the ceramic layers 22 may be made of, for example, a dielectric ceramic mainly constituted by $BaTiO_3$, $CaTiO_3$, $SrTiO_3$, or $CaZrO_3$, for example. Additional constituents, such as a Mn compound, a Fe compound, a Cr compound, a Co compound, and a Ni compound may be added to the main constituent. It is preferable that the thicknesses of the ceramic layers 22 be about 0.1 μm to about 10 μm, for example, after being fired.

It is preferable that the first and second inner conductors 32 and 33 and the first and second via conductors 36 and 37 be made of a metal selected from a group of, for example, Ni, Cu, Ag, Pd, and Au, or made of an alloy including the metal. It is preferable that the first and second inner conductors 32 and 33 be made of the same metal, and the first and second via conductors 36 and 37 be made of the same metal. It is preferable that the thicknesses of the first and second inner conductors 32 and 33 be about 0.1 μm to about 2.0 μm, for example, after being fired. It is preferable that the diameters of the first and second via conductors 36 and 37 be substantially about 50 μm to about 150 μm, for example, after being fired. The same type of ceramic composing the ceramic layers 22 may be added to the first and second inner conductors 32 and 33 or to the first and second via conductors 36 and 37.

It is preferable that the first and second outer terminal electrodes 30 and 31 be made of a metal selected from a group of, for example, Ni, Cu, Ag, Pd, and Au, or made of an alloy including the metal. The first and second outer terminal electrodes 30 and 31 may have a structure in which a plated layer is stacked on an underlying layer. It is preferable that the plated layer be made of a metal selected from a group of, for example, Cu, Ni, Sn, Pb, Au, Ag, Pd, Bi, and Zn, or made of an alloy including the metal. If the monolithic ceramic capacitor is to be solder mounted, it is preferable that a Ni plated layer and a Sn plated layer be formed on the underlying layer in this order. If the monolithic ceramic capacitor 21 is to be mounted with an electroconductive adhesive or by wire bonding, it is preferable that an Au plated layer be formed on an outermost layer. If the monolithic ceramic capacitor 21 is to be buried in a resin substrate, it is preferable that a Cu plated layer be formed on an outermost layer. It is preferable that the first and second outer terminal electrodes 30 and 31 have thicknesses of about 20 μm to about 60 μm, for example. It is preferable that the thickness of each plated layer be about 1 μm to about 15 μm, for example.

Hereinafter, an example of a method for manufacturing the monolithic ceramic capacitor 21 is described.

In the first step, ceramic green sheets, an electrically conductive paste for inner conductors, an electrically conductive paste for via conductors, and an electrically conductive paste for outer terminal electrodes are prepared. Known organic binders and known organic solvents can be used as a binder and a solvent included in the ceramic green sheets and the electrically conductive pastes.

In the second step, inner conductor patterns are formed on the ceramic green sheets by, for example, printing the electrically conductive paste in a specified pattern by a method such as screen printing. The positions in which via holes are formed, which are described below, are determined in accordance with the printing direction.

In the third step, a specified number of ceramic green sheets are stacked so as to define a mother stack. The mother stack is pressed in the stack direction by isostatic pressing or the like.

In the fourth step, a specified number of via holes, which extend through the mother stack in the stack direction, are formed in specified positions with a laser or by NC punching or the like. At this time, the center of each via hole is positioned in the pattern of the inner conductor in such a manner that the center of the via hole is deviated from the center of the opening.

In the fifth step, via holes are filled with the electrically conductive paste for the via conductors by a method such as screen printing. It is preferable that main surfaces of the mother stack be masked so as to prevent the electrically conductive paste from being applied to an area outside the via holes.

In the sixth step, the mother stack is cut so as to obtain individual green ceramic bodies.

In the seventh step, the green ceramic body is fired. It is preferable that the firing temperature be about 900° C. to about 1300° C., although the temperature depends on the materials of the ceramic layers and the electrodes. Atmosphere, $N_2$, water vapor with $N_2$, or the like can be selectively used as a firing environment.

In the eighth step, outer terminal electrode patterns are formed on the main surfaces of the ceramic body, which has been fired, by printing the electrically conductive paste on the main surfaces in a specified pattern. In order to expose the ends of the via conductors to the outside, the main surfaces of the ceramic body may be polished before the outer terminal electrode patterns are formed.

In the ninth step, the outer terminal electrodes are formed by baking the outer terminal electrode pattern. It is preferable that the baking temperature be about 700° C. to about 900° C., for example.

In the tenth step, surfaces of the outer terminal electrodes are plated as necessary. Before being plated, the surfaces of the outer terminal electrodes may be polished.

Figure 11:
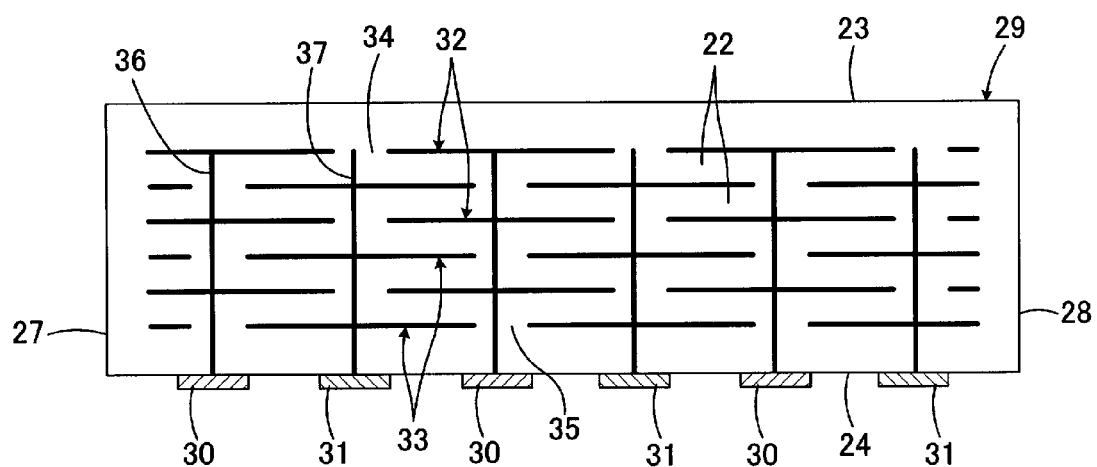
FIG. 11 is a view corresponding to FIG. 1, showing a monolithic ceramic capacitor according to a second preferred embodiment of the present invention.
Figure 12:
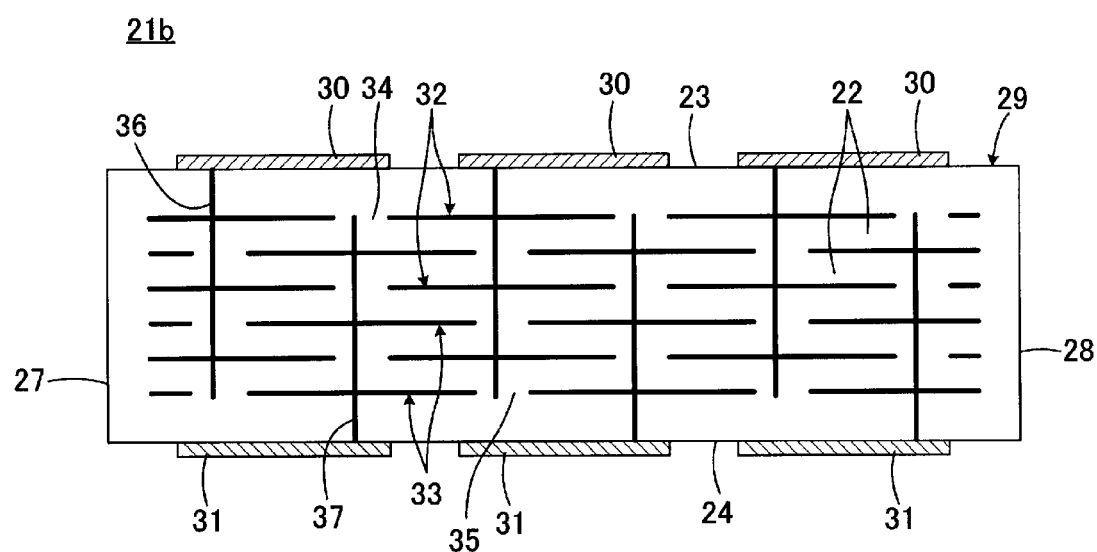
FIG. 12 is a view corresponding to FIG. 1, showing a monolithic ceramic capacitor according to a third preferred embodiment of the present invention.
Figure 13:
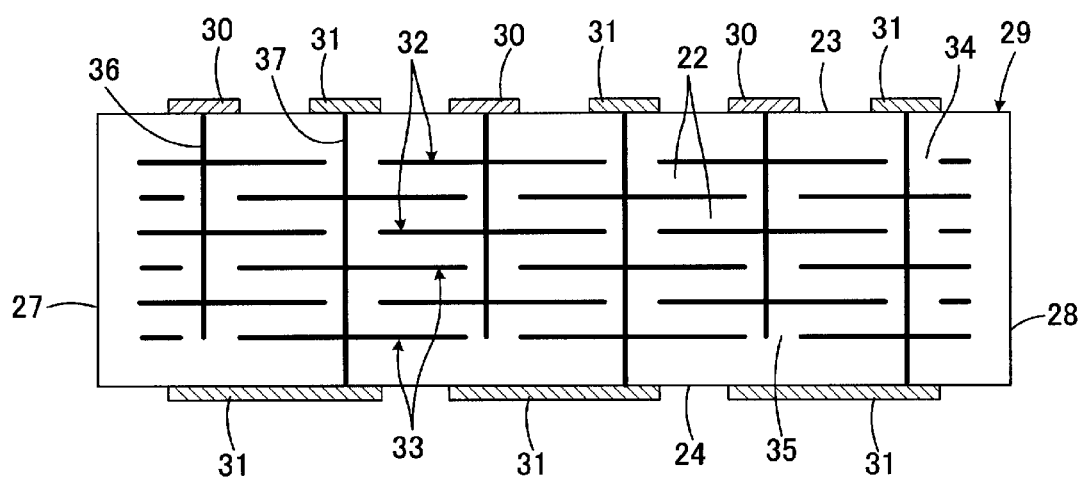
FIG. 13 is a view corresponding to FIG. 1, showing a monolithic ceramic capacitor according to a fourth preferred embodiment of the present invention.

FIGS. 11 to 13 are views corresponding to FIG. 1, respectively for illustrating second to fourth preferred embodiments of the invention. In the second to fourth preferred embodiments, the disposition of the outer terminal electrodes is modified. In FIGS. 11 to 13, the elements corresponding to the elements shown in FIG. 1 are indicated by like numerals used in FIG. 5, and redundant description is omitted.

Referring to FIG. 11, in a monolithic ceramic capacitor 21*a* according to the second preferred embodiment, both the first and second outer terminal electrodes 30 and 31 are formed only on the second main surface 24.

Referring to FIG. 12, in a monolithic ceramic capacitor 21*b* according to the third preferred embodiment, only the first outer terminal electrodes 30 are formed on the first main surface 23, and only the second outer terminal electrodes 31 are formed on the second main surface 24.

Referring to FIG. 13, in a monolithic ceramic capacitor 21*c* according to the fourth preferred embodiment, both the first and second outer terminal electrodes 30 and 31 are formed on the first main surface 23, and only the second outer terminal electrodes 31 are formed on the second main surface 24.

Figure 14:
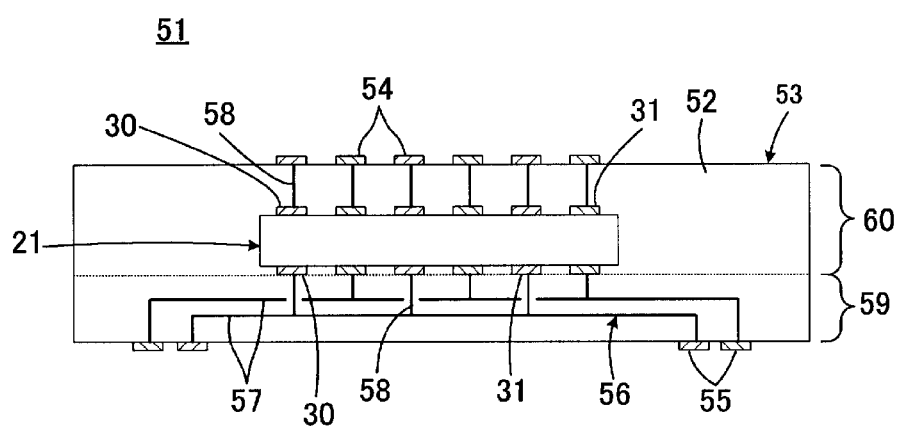
FIG. 14 is a schematic sectional view of a circuit board including the monolithic ceramic capacitor according to the first preferred embodiment of the present invention.

FIG. 14 is a schematic sectional view of a circuit board 51 including, for example, the monolithic ceramic capacitor 21 according to the first preferred embodiment of the invention.

Referring to FIG. 14, the circuit board 51 includes a board body 53 having stacked insulating layers 52, land electrodes 54 and 55 respectively formed on an upper main surface and a lower main surface of the board body 53, and a wiring conductor 56 formed in the board body 53. Interfaces between the stacked insulating layers 52 of the board body 53 are not shown in FIG. 14. The wiring conductor 56 includes in-plane conductors and via conductors 58. The in-plane conductors 57 extend parallel or substantially parallel to the interfaces between the insulating layers 52. The via conductors 58 extend through the insulating layers 52 in the thickness direction. The insulating layers 52 are made of, for example, a resin.

The monolithic ceramic capacitor 21 is installed in the board body 53.

The monolithic ceramic capacitor 21 can be buried in the board body 53 by, for example, mounting the monolithic ceramic capacitor 21 on a rigid resin substrate 59 (an area below a dotted line in FIG. 14), covering the monolithic ceramic capacitor 21 with a prepreg sheet 60 (an area above the dotted line the in FIG. 14) including an unset thermosetting resin, pressing the prepreg sheet 60 so that the monolithic ceramic capacitor 21 is buried in the prepreg sheet 60, and then thermosetting the prepreg sheet 60.

Land electrodes 54 and 55 are formed by, for example, etching a metal foil made of Cu or other suitable material. Bumps made of Au or an electrically conductive resin may be formed right above the via conductors 58 so that the bumps serve as the land electrodes 54 and 55.

The in-plane conductors 57 may be formed by, for example, etching a metal foil made of Cu or the like.

The via conductors 58 are formed, for example, by filling the via holes with an electrically conductive resin including a metal powder, such as Cu powder, and a thermosetting resin, such as an epoxy resin. Alternatively, the via conductors 58 may be formed by so-called via filling, by which the via holes are filled with a metal by plating.

The monolithic ceramic capacitor 21 can be connected to the land electrodes 54 on the upper main surface of the board body 53 with the via conductors 58 by burying the monolithic ceramic capacitor 21, using a laser from above the board body 53 so as to form the via holes, forming the via conductors 58 by via filling, and then forming the land electrodes 54.

Figure 15:
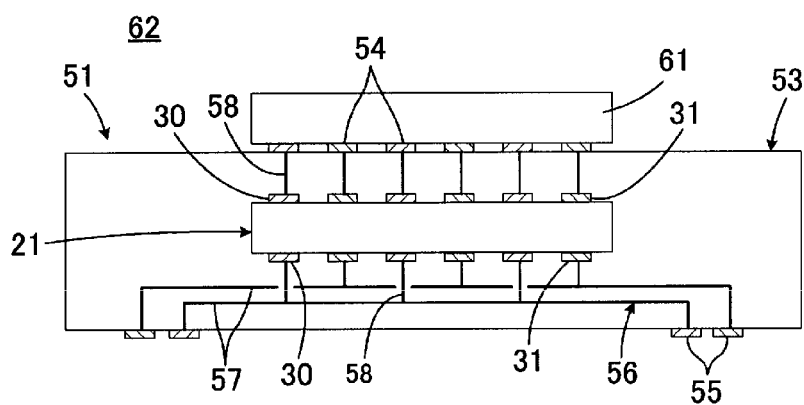
FIG. 15 a schematic sectional view of a circuit module in which an MPU is mounted on the circuit board shown in FIG. 14.
Figure 16:
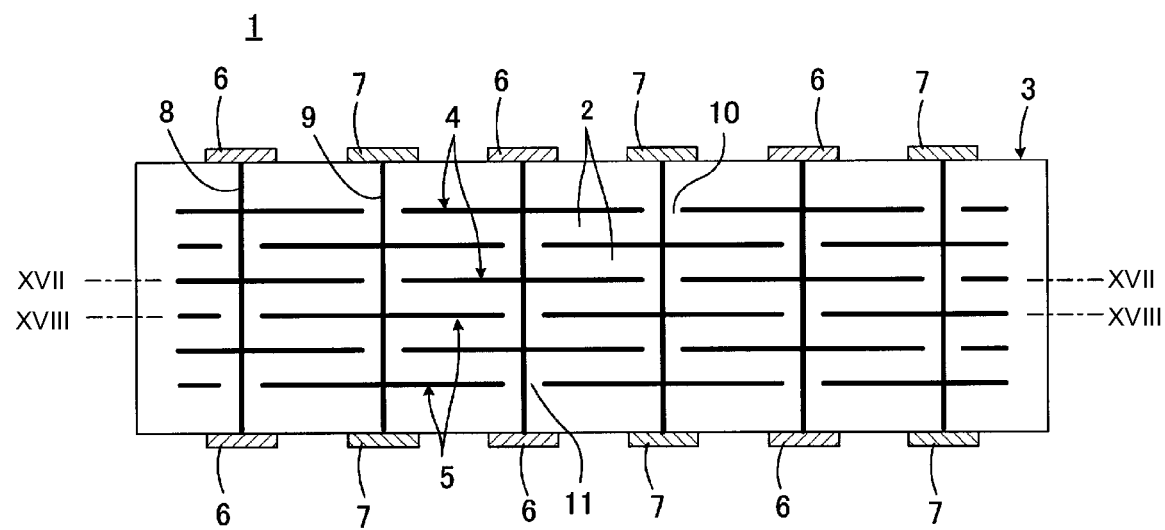
FIG. 16 is a sectional front view of a conventional monolithic ceramic capacitor as an example of a monolithic ceramic electronic component that is a related art of the invention.
Figure 17:
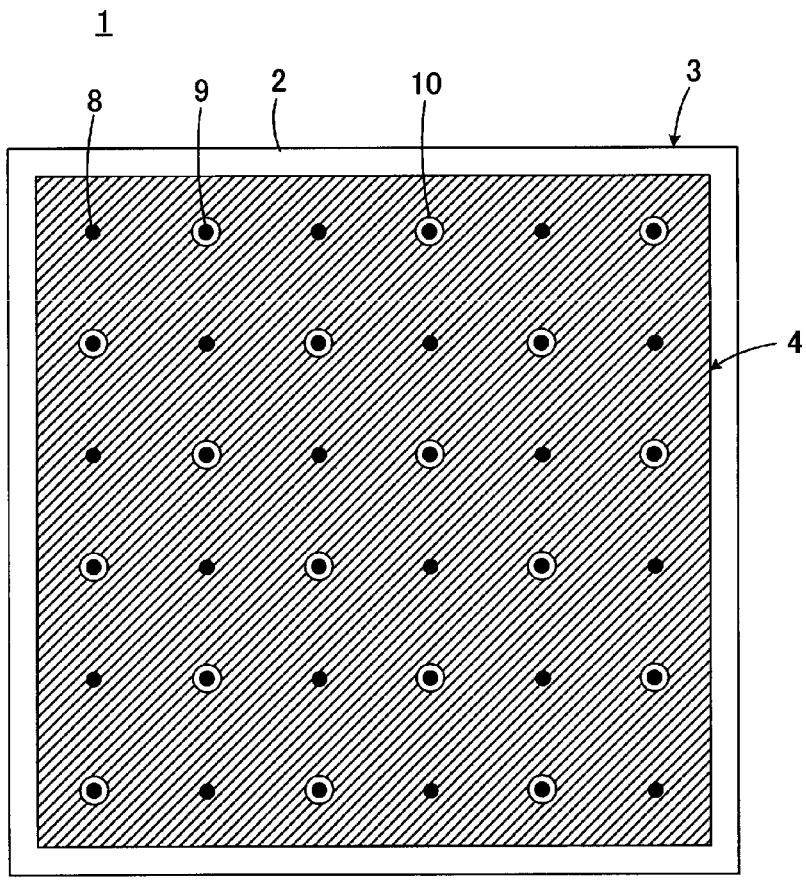
FIG. 17 is a sectional plan view of the monolithic ceramic capacitor shown in FIG. 16, taken along line XVII-XVII of FIG. 16.
Figure 18:
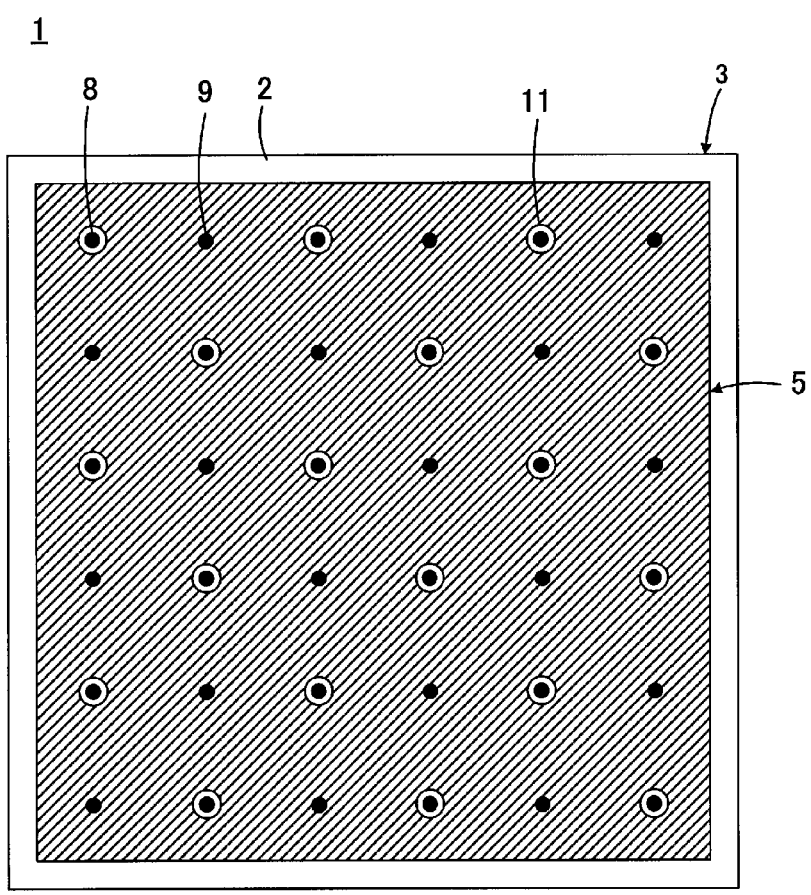
FIG. 18 is a sectional plan view of the monolithic ceramic capacitor shown in FIG. 16, taken along line XVIII-XVIII of FIG. 16.
Figure 19:
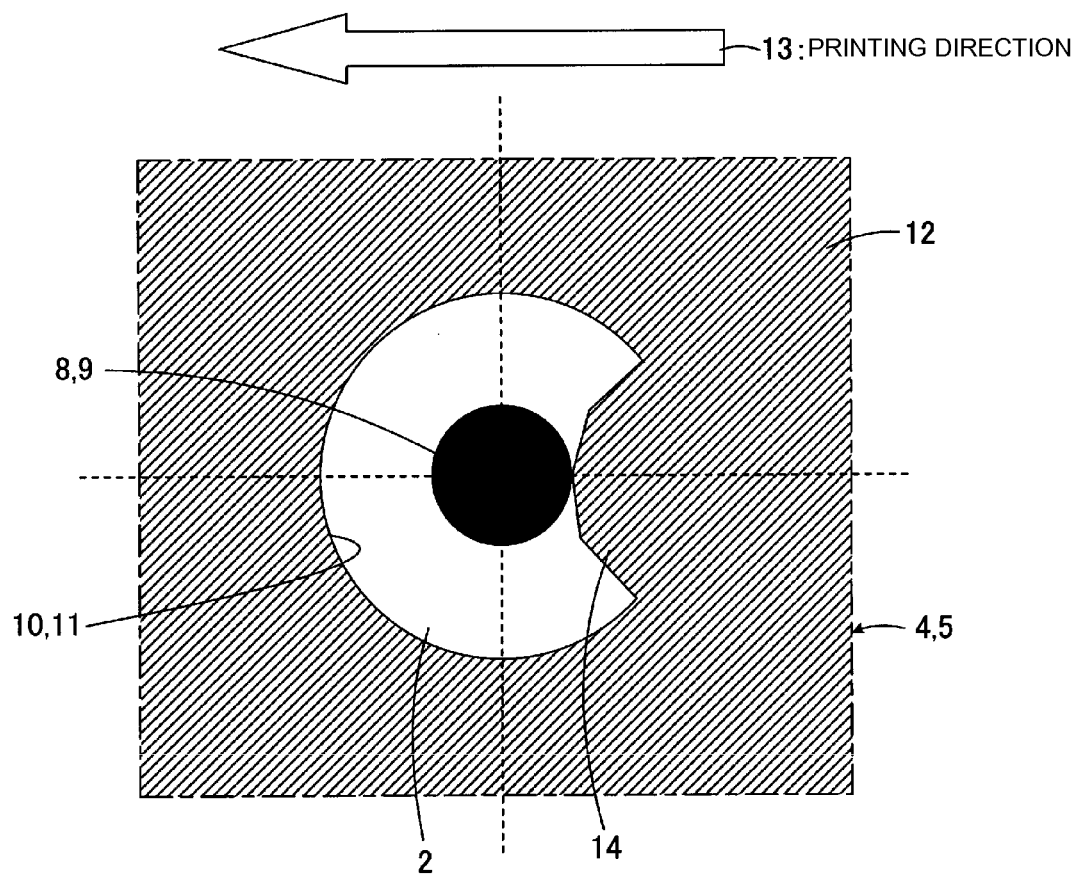
FIG. 19 is an enlarged view for illustrating a problem to be solved by preferred embodiments of the present invention, showing a state in which a smear is generated in an opening of an inner conductor when an electrically conductive paste is printed.

Referring to FIG. 15, an MPU 61 is mounted on the circuit board 51 shown in FIG. 14 so as to obtain a circuit module 62.

Although the present invention has been described with regard to a monolithic ceramic capacitor, the present invention is not limited to a monolithic ceramic capacitor. The present invention is applicable to a monolithic ceramic electronic component in which via conductors extend through openings of inner conductors, such as a monolithic inductor or an LC composite component.

Although the via conductors shown in the drawings have circular sections, the scope of the present invention is not limited by the shape of the section of a via conductor.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a monolithic ceramic electronic component comprising the steps of:

preparing a plurality of ceramic green sheets;

forming an inner conductor having openings on a specific one of the plurality of ceramic green sheets by printing an electrically conductive paste, such that the inner conductor is disposed between the specific one of the plurality of ceramic green sheets and another one of the plurality of ceramic green sheets; and forming via conductors in positions in a pattern corresponding to the openings of the inner conductor such that the via conductors extend through the specific one of the plurality of ceramic green sheets in a thickness direction of the specific one of the plurality of ceramic green sheets; wherein in the step for forming the inner conductor, the inner conductor is formed such that, when viewed in the thickness direction of the specific one of the plurality of ceramic green sheets, a center of each of the via conductors is deviated from a center of the opening in a direction in which the electrically conductive paste is printed.

* * * * *